United States Patent
Karthaus

(10) Patent No.: US 7,375,600 B2
(45) Date of Patent: May 20, 2008

(54) INTEGRATED QUARTZ OSCILLATOR CIRCUIT

(75) Inventor: Udo Karthaus, Ulm (DE)

(73) Assignee: Atmel Germany GmbH, Heilbronn (DE)

( * ) Notice: Subject to any disclaimer, the term of this patent is extended or adjusted under 35 U.S.C. 154(b) by 45 days.

(21) Appl. No.: 11/482,933

(22) Filed: Jul. 10, 2006

(65) Prior Publication Data

US 2007/0008047 A1    Jan. 11, 2007

(30) Foreign Application Priority Data

Jul. 8, 2005    (DE)    ............. 10 2005 032 468

(51) Int. Cl.
*H03B 5/32* (2006.01)

(52) U.S. Cl. ............... 331/158; 331/74; 331/135; 331/116 R; 331/116 FE

(58) Field of Classification Search .......... 331/158, 331/116 R, 116 FE, 135, 74
See application file for complete search history.

(56) References Cited

U.S. PATENT DOCUMENTS

| | | | |
|---|---|---|---|
| 4,091,338 A | | 5/1978 | Morihisa |
| 4,405,906 A | * | 9/1983 | Luscher ............ 331/116 FE |
| 4,560,955 A | | 12/1985 | Sauer |
| 6,380,816 B1 | | 4/2002 | Okaguchi |
| 6,606,007 B1 | | 8/2003 | Washburn |

FOREIGN PATENT DOCUMENTS

| | | |
|---|---|---|
| EP | 0133618 A1 | 3/1985 |
| EP | 0400425 A1 | 12/1990 |

OTHER PUBLICATIONS

Bernd Neubig et al., "Das große Quarzkochbuch," © 1997 Franzis-Verlag GmbH, 85622 Feldkirchen, pp. 247-252; ISBN 3-7723-5853-5.
Benjaminson A., "A Crystal Oscillator With Bidirectional Frequency Control and Feedback ALC", Electrical and Electronics Engineers, Proceedings of the Annual Frequency Control Symposium, 1986, New York, IEEE, US, Bd. Symp. 40, 1986, pp. 344-349.

* cited by examiner

*Primary Examiner*—Arnold Kinkead
(74) *Attorney, Agent, or Firm*—Muncy, Geissler, Olds & Lowe PLLC

(57) ABSTRACT

An integrated quartz oscillator circuit is disclosed having a capacitive voltage divider, which has a first capacitor and a second capacitor, as well as having a first transconductance amplifier, which is placed in a loop connecting a first terminal and a second terminal of the first capacitor. An input of the first transconductance amplifier is connected to a center tap between the first capacitor and the second capacitor, an output of the first transconductance amplifier is connected to the first junction of the first capacitor, and the quartz oscillator circuit has a conductive element connected parallel to the second capacitor.

11 Claims, 3 Drawing Sheets

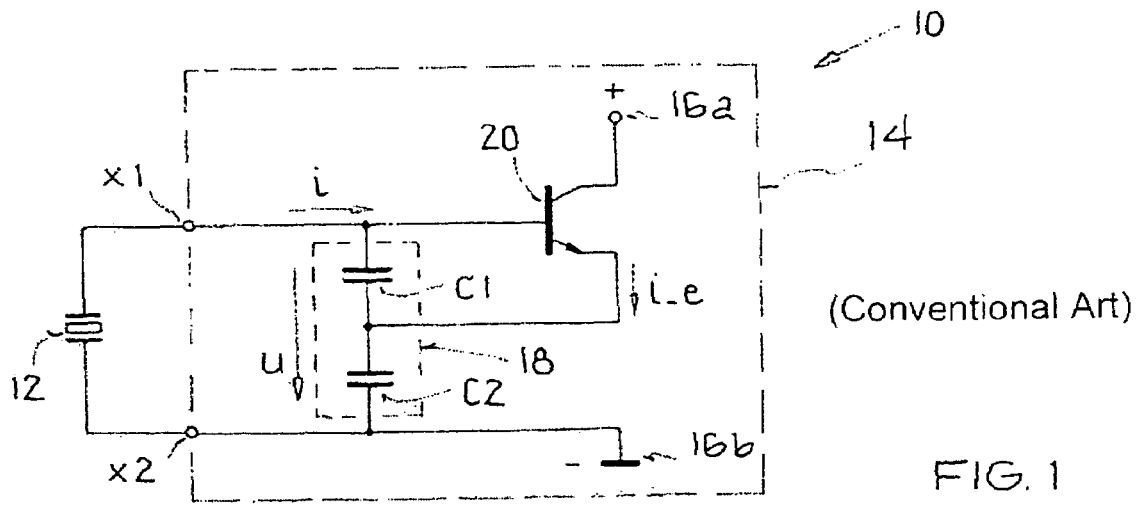
(Conventional Art) FIG. 1
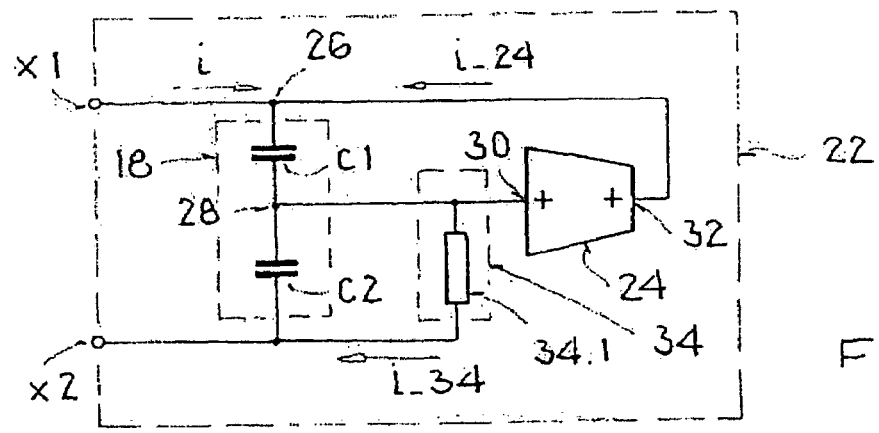
FIG. 2
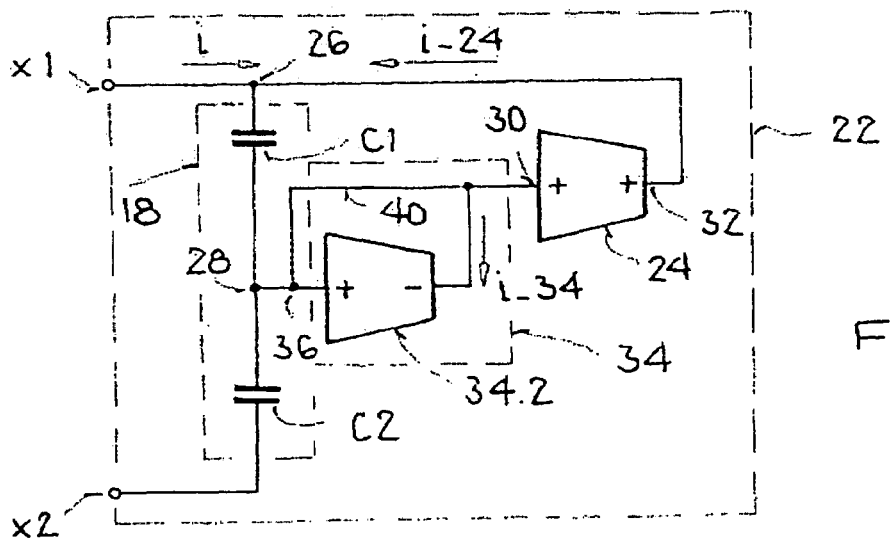
FIG. 3

INTEGRATED QUARTZ OSCILLATOR CIRCUIT

This nonprovisional application claims priority under 35 U.S.C. § 119(a) on German Patent Application No. DE 102005032468, which was filed in Germany on Jul. 8, 2005, and which is herein incorporated by reference.

BACKGROUND OF THE INVENTION

1. Field of the Invention

The present invention relates to an integrated quartz oscillator circuit having a capacitive voltage divider, which has a first capacitor and a second capacitor, as well as having a first transconductance amplifier, which is placed in a loop connecting a first junction and a second junction of the first capacitor.

2. Description of the Background Art

Quartz oscillators are used in electronic systems to provide system-internal reference frequencies and/or clock signals. Oscillating crystals exhibit damping, which can be characterized in an electrical equivalent circuit as an ohmic resistor, which is in series with a series resonant circuit of a capacitor and an inductor. To produce a stable oscillation, the energy loss occurring during the oscillation of an electrical charge in the resistor must be replaced.

This occurs, for example, by the aforementioned quartz oscillator circuit, when the oscillating crystal, optionally still supplemented with a load capacitor, is connected parallel to the capacitive voltage divider of the circuit. This type of quartz oscillator circuit is known as a Colpitts circuit with both integrated and external load capacitors. The transconductance amplifier can be a simple transistor in a collector circuit, whose collector is connected to a positive supply potential, its emitter as the amplifier output to a center tap of the voltage divider, and its base as the amplifier input to a complementary terminal of the first capacitor. The capacitive voltage divider characteristic for the Colpitts circuit determines the fractional amount of a voltage positively fed back via the thus formed loop. In the Colpitts oscillator, a voltage across one of the capacitors is measured and a current dependent on the measured voltage is supplied to the other capacitor. This results in problems in a symmetrizing of the circuit, therefore in a symmetric circuit design, which reacts less sensitively to interfering signals, occurring in a ground connection. All approaches in which the oscillating crystal or a load capacitor connected to the oscillating crystal is connected to ground are sensitive to interfering signals at the ground node. It is therefore usually necessary in integrated circuits, which have still other circuit parts apart from an (asymmetric) quartz oscillator circuit, to provide a separate ground pin for the quartz oscillator circuit.

SUMMARY OF THE INVENTION

It is therefore an object of the present invention to provide a quartz oscillator circuit, which can be symmetrized as needed.

The circuit of the invention differs from Colpitts circuit in that an input of the transconductance amplifier is connected to a center tap between the first and the second capacitor, an output of the transconductance amplifier is connected to a complementary junction of the first capacitor, and the quartz oscillator circuit has a conductive element connected to the center tap parallel to the second capacitor. In the circuit of the present invention, a voltage across the second capacitor is measured and a current dependent on the measured voltage is supplied to the voltage divider. The associated current flow through the second capacitor would falsify the voltage measurement. This falsification causes the negative resistance Re(z), provided to the oscillating crystal, to be considerably reduced. As a result, a reliable, rapid oscillation build-up would not be assured. The conductive element connected parallel to the second capacitor compensates for the effect of the aforementioned current flow through the second capacitor on the voltage measurement. Therefore, a similar high negative resistance Re(z) as in Colpitts oscillator results, so that a rapid and reliable oscillation build-up is assured.

In this regard, a transconductance amplifier is understood to be a voltage-controlled current source, therefore an amplifier, whose output current depends on its input voltage. In the simplest case, such a transconductance amplifier can be realized by a transistor in an emitter circuit (or source circuit), whose base (or gate) is connected to the center tap, whose emitter (source) is connected to ground through a resistor, and whose collector (drain) is connected to a constant current source. Complete OTAs (Operational Transconductance Amplifiers) can also be used.

The invention provides an alternative quartz oscillator circuit, which can be symmetrized by simple circuit engineering measures and which requires only two contact pins (signal and ground in the asymmetric basic circuit; a differential signal in the symmetric design). The asymmetric basic circuit is characterized by an especially simple structure, permits the connection of an external load capacitor, and has a high negative resistance amount-wise, which leads to a rapid and reliable oscillation build-up. The rapid and reliable oscillation build-up is thereby also assured when a new oscillating crystal or one stored for a long time has an increased resistance during the oscillation build-up (DLD effect). The DLD effect can lead to the situation in which resistances up to 50 times higher than during normal operation occur.

A design which is especially simple, thereby cost-effective, and space-saving in circuitry terms is characterized in that the conductive element is an ohmic resistor connected parallel to the second capacitor.

In a further embodiment, the conductive element can be a second transconductance amplifier, which has an input, an output, and a feedback connecting the input and output, whereby the input and output are connected between the first capacitor and the second capacitor. The input and output are connected furthermore to an input of the first transconductance amplifier.

Due to the connection of the input and output, the second transconductance amplifier functions like a resistor, so that both are exchangeable in this respect. In comparison with the resistor, the advantage of the second transconductance amplifier is that it enables regulation of the quotients of current and voltage, therefore the conductance inversely proportional to the resistance.

Another embodiment provides that the capacitive voltage divider has a series connection comprising a first capacitor, a second capacitor, and a third capacitor.

This embodiment represents a symmetric variant of the quartz oscillator circuit. In comparison with the asymmetric variant, the symmetric variant has a reduced sensitivity to interfering signals in a ground line of the quartz oscillator circuit.

The symmetric variant, like the asymmetric variant as well, can work with an ohmic resistor, connected parallel to the second capacitor, as the conductive element. Alternatively, the conductive element can be a second transconductance amplifier, which has a differential input and a differential output, both of which are connected parallel to the second capacitor. In other words: an input is connected between the first and the second capacitor, another input is connected between the second and the third capacitor, and in each case an output is connected to an input of the first transconductance amplifier.

In these embodiments of the symmetric variant, the same advantages arise as in the corresponding embodiments of the asymmetric variant, whereby in the symmetric variant the reduced sensitivity to interfering signals in a ground line of the quartz oscillator circuit occurs again.

It is also preferable that a load capacitor, which may be necessary for the operation of an oscillating crystal, is not integrated into the quartz oscillator circuit, but is connected as an external capacitor. This saves chip area in the integrated quartz oscillator circuit. Another advantage is that the charge oscillating back and forth between the oscillating crystal and load capacitor, in the case of the external load capacitor does not flow into the integrated circuit. This facilitates an ESD protection of the quartz oscillator circuit (ESD=electrostatic discharge), because protection circuits with a series resistor are also possible.

An alternative embodiment has an integrated load capacitor. This has the advantage that a desired ratio of the capacitances of the capacitive voltage divider to the load capacitance can be better adjusted during circuit manufacturing, which leads to a more precisely defined negative oscillator resistance.

Another embodiment has at least one voltage follower, which is placed in a connection of a connecting terminal of the oscillator circuit with the capacitive voltage divider. This reduces further a current flow between the oscillating crystal and the capacitive voltage divider in the oscillator circuit.

Further, the first transconductance amplifier can have a transistor in the emitter circuit. As an alternative or in addition, it is preferred that at least one transconductance amplifier has a differential stage with two transistors.

These embodiments represent specific circuitry examples for transconductance amplifiers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 illustrates a conventional Colpitts oscillator;

FIG. 2 is a first asymmetric embodiment of a quartz oscillator according to an embodiment of the invention with a resistor as the conductive element;

FIG. 3 is a modification of the quartz oscillator of FIG. 2 with a transconductance amplifier as the conductive element;

DETAILED DESCRIPTION

Figure 4:
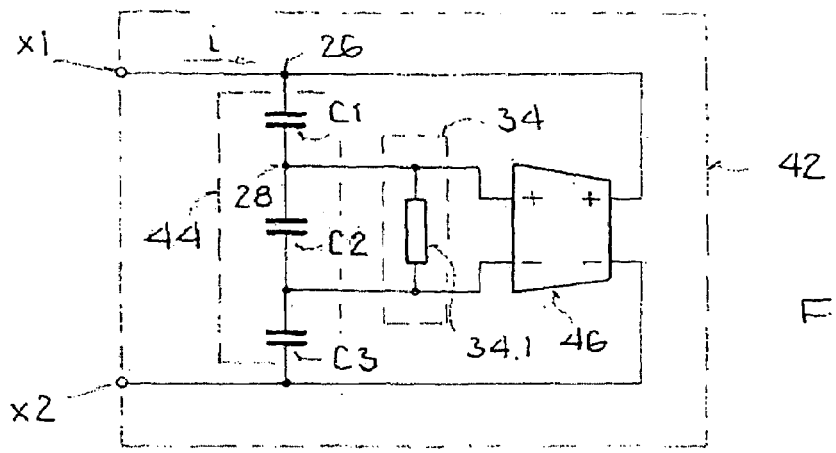
FIG. 4 is a symmetric embodiment of a quartz oscillator of the invention with a resistor as the conductive element.

FIG. 1 shows an oscillator circuit 10, known as a Colpitts oscillator, of an oscillating crystal 12 and a quartz oscillator circuit 14 with an internal energy supply 16a, 16b. The oscillating crystal 12 is connected to terminals X1, X2 of oscillator circuit 14. Oscillator circuit 14 has a capacitive voltage divider 18 comprising a first capacitor C1 and a second capacitor C2, as well as a transconductance amplifier in the form of a transistor 20 in the collector circuit, whose base-emitter section is parallel to the first capacitor C1 and whose transconductance gm is equal to a dissipation of its collector current according to its base-emitter voltage.

Oscillator circuit 14 unattenuates the oscillating crystal, as is generally known, when its resistance is negative and amount-wise greater than the damping resistance of oscillating crystal 12. For oscillating crystal 12, oscillator circuit 14 represents a complex resistance $z=u/i.$ Only the real part Re(z) decides whether the circuit oscillates or does not oscillate. The voltage u is the sum of voltages u1, u2 across capacitors C1, C2. Capacitor C2 is charged and discharged by the current i and the emitter current i_e of transistor 20. It therefore applies for its voltage u2 that $u2=(i+i\_e)*z2,$ where z2 represents the complex resistance of C2. The complex resistance z of oscillator circuit 14 then results as $z=(u1+u2)/i=z+z2+(i\_e*z2)/i.$ Insertion of $i\_e=i/j\omega C1*gm$ and $z2=1/j\omega C2$ then produces the following real part Re(z) of z:

$$Re(z) = -\frac{gm}{\omega^2 C1 C2}.$$

Heuristically expressed, transistor 20 measures the voltage u1 across C1 and supplies an unattenuating emitter current i_e, proportional to u1, in the center tap of capacitive voltage divider 18. This current flows only through C2 but not through C1.

FIG. 2 represents a first asymmetric embodiment of a quartz oscillator circuit 22 of the invention. In this regard, the same numbers designate the same elements in all figures. FIG. 2 shows an integrated quartz oscillator circuit 22 with a capacitive voltage divider 18 of the first capacitor C1 and second capacitor C2, and a first transconductance amplifier 24 in a loop, connecting a first junction 26 and a second junction 28 of the first capacitor C1. The second junction 28 represents a center tap of voltage divider 18. An input 30 of transconductance amplifier 24 is connected to center tap 28 between the first capacitor C1 and the second capacitor C2. An output 32 of transconductance amplifier 24 is connected to complementary first junction 26 of the first capacitor C1. Furthermore, quartz oscillator circuit 22 has a conductive element 34 connected to center tap 28. In the embodiment shown in FIG. 2, conductive element 34 is an ohmic resistor 34.1 connected parallel to the second capacitor C2.

The effects of the structural differences between the subjects of FIG. 1 and FIG. 2 become clear when the currents acting on the capacitors C1 and C2 are considered. In the case of FIG. 1, only current i acts on C1, whereas the sum of currents and i_e affects C2. In the case of FIG. 2, the sum of the currents i and i_24 acts on the first capacitor C1, whereby the latter current is provided by transconductance amplifier 24 as a function of the voltage at its input 30. The current i_24 therefore increases the current acting on C1 and thereby realizes a positive feedback. Conductive element 34 in the form of resistor 34.1, in contrast, allows a current flow i_34. As a result, it is not the sum of i and i_24 that acts on the second capacitor C2, but only the difference of the positively counted sum i and i_24 and the negatively counted current i_34. Conductive element 34 thereby realizes a negative feedback, thus stabilizes the operating point of the oscillator circuit, and at the same time increases the negative real part Re(z) of the impedance z of the oscillator circuit, so that oscillating crystal 12 begins to oscillate more rapidly and more reliably.

FIG. 3 shows a modification of quartz oscillator circuit 22 of FIG. 1 with a second transconductance amplifier 34.2 as conductive element 34. The second transconductance amplifier 34.2 has an input 36, an output 38, and a feedback 40 connecting input 36 and output 38, whereby input 36 and output 38 are each connected to center tap 28 between the first capacitor C1 and the second capacitor C2. Due to feedback 40, second transconductance amplifier 34.2 acts like resistor 34.1 of FIG. 2. With a fixed resistance value R, resistor 34.1 and transconductance amplifier 34.2 are therefore exchangeable. The advantage of transconductance amplifier 34.2 is an adjustability, which, for example, when an oscillating crystal subject to a DLD effect is turned on, allows adjustment to the initially high and then declining damping resistance of the oscillating crystal.

FIG. 4 shows a symmetric embodiment of another quartz oscillator circuit 42 of the invention with a capacitive voltage divider 44 comprising a series connection of a first capacitor C1, a second capacitor C2, and a third capacitor C3. The third capacitor C3 corresponds in its value preferably to the value of the first capacitor C1. Conductive element 34, which in FIG. 4 is again realized as resistor 34.1, is connected parallel to the second capacitor C2. The symmetric embodiment furthermore has a differential first transconductance amplifier 46. This symmetric and differential version is much less sensitive to interfering signals in the ground line, therefore at terminal X2, than the asymmetric version according to FIGS. 2 and 3.

Figure 5A:
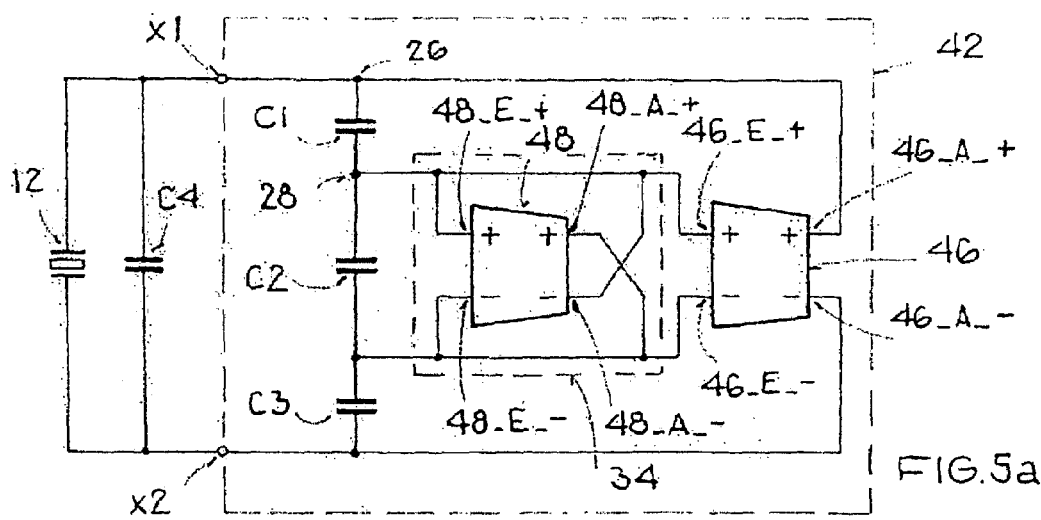
FIGS. 5a-b illustrate a symmetric embodiment with a transconductance amplifier as the conductive element.
Figure 5B:
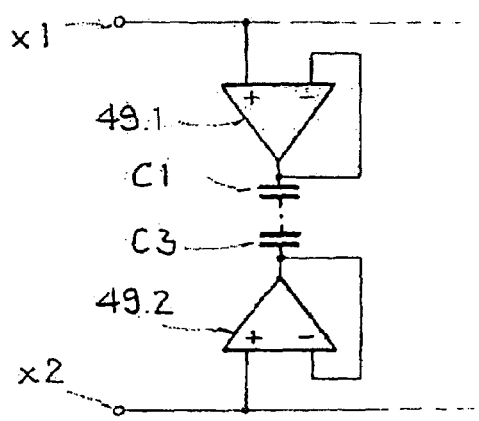

FIG. 5a shows an alternative embodiment of the symmetric and differential variant 42, in which conductive element 34 is realized as a second differential transconductance amplifier 48. In addition, the subject of FIG. 5a has further an external load capacitor C4, which is also preferably present in the subjects of FIGS. 2 through 4 and which represents a load capacitor matched to the resonance frequency of oscillating crystal 12. It is also possible to provide load capacitor C4 not externally but within integrated quartz oscillator circuit 42 (or 22); this also applies to the subjects of FIGS. 2 through 5. FIG. 5b shows an embodiment of the circuit according to FIG. 5a, in which a voltage follower 49.1, 49.2 is placed between the external capacitors C1, C3 of the capacitive voltage divider and the terminals X1, X2. The advantage of this optionally present voltage follower is that still less current flows back and forth between quartz 12 and oscillator circuit 42. This is advantageous for the same reasons already mentioned in connection with external load capacitor C4. Like load capacitor C4, voltage follower 49.1, 49.2 can also be used in the subjects of FIGS. 2 through 4.

It generally applies to transconductance amplifier 46 and conductive elements 34, 48 in the differential variant that outputs 46_A_+, 46_A_− of first transconductance amplifier 46 are to be connected to terminals X1 and X2, therefore to load capacitor C4, whereas conductive element 34, 48 is to be connected parallel to second capacitor C2. When a second differential transconductance amplifier 48 is used as conductive element 34, the inputs 48_E_+, 48_E_− and outputs 48_A_+, 48_A_− are to be cross-connected, so that second transconductance amplifier 48 acts as a resistor. Because inputs 46_E_+, 46_E_− of first transconductance amplifier 46 and inputs 48_E_+, 48_E_− of second transconductance amplifier 48 are also (cross-) connected, the arrangement of the two transconductance amplifiers 46, 48 can also be realized by a single transconductance amplifier, whose output current is provided twice with different current intensities via a current mirror arrangement with a predefined current ratio. In this case, a "cross" connection is understood to be a connection from " . . . _+" to " . . . _−" and vice versa, therefore a negative feedback.

For the operating point adjustment, one resistor $R_b$ each can be disposed between the terminal X1 and output 48_A_+ and between the terminal X2 and output 48_A_−. For the instances when the value of C1 is equal to the value of C3 and equal to a value 2C, the following applies to the input impedance of oscillator circuit 42 including load capacitor C4:

$$z = \frac{R_b^{-1} + g_{m2} + j\omega(C + C2)}{(g_{m1} + g_{m2})R_b^{-1} - \omega^2(C4C + C4C2 + CC2) + j\omega((C4 + C)g_{m2} - Cg_{m1} + (C4 + C2)R_b^{-1})}$$

With disregard of the resistors, this simplifies to:

$$z = \frac{g_{m2} + j\omega(C + C2)}{-\omega^2(C4C + C4C2 + CC2) + j\omega((C4 + C)g_{m2} - Cg_{m1})}$$

And for the special case $(C4+C)g_{m2}=Cg_{m1}$, the following results furthermore:

$$z = \frac{1}{j\omega(C4 + (C^{-1} + C2^{-1})^{-1})} - \frac{g_{m2}}{\omega^2(C4C + C4C2 + CC2)}$$

Figure 6:
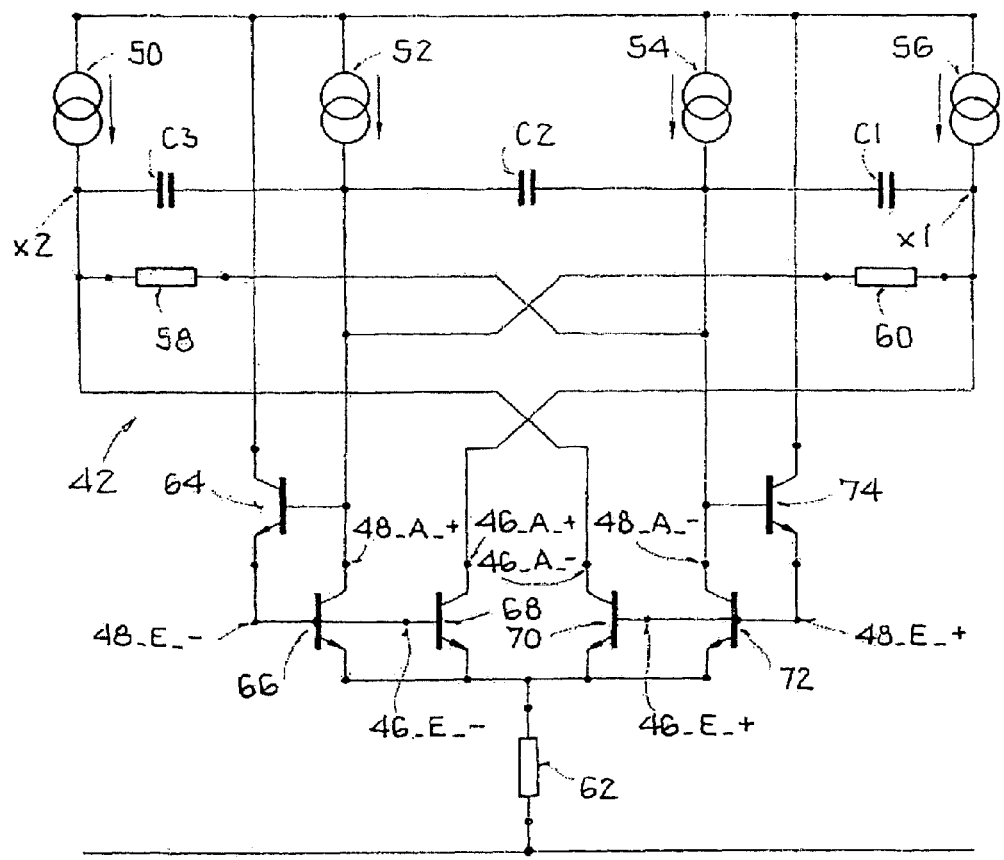
FIG. 6 is a symmetric embodiment with differential stages having transconductance amplifiers.

FIG. 6 shows a symmetric embodiment of a quartz oscillator circuit 42 with transconductance amplifiers 46, 48, having differential stages, as a specific circuitry embodiment of the subject of FIG. 5. Quartz oscillator circuit 42 has, in addition to the three capacitors C1, C2, and C3, four current sources 50, 52, 54, and 56, three resistors 58, 60, and 62, and six transistors 64, 66, 68, 70, 72, and 74. Resistors 58 and 60 are used to establish the operating point at the terminals X1 and X2. Transistors 68 and 70 together form a differential stage of first transconductance amplifier 46. Similarly, transistors 66 and 72 form a differential stage of second transconductance amplifier 48. At a ratio of transconductance values gm1 of first transconductance amplifier 46 and gm2 of second transconductance amplifier 48, current sources 52 and 54 provide 10 times the current intensity of current sources 50 and 56. Accordingly, 10 times the current intensity that is controlled by transistors 66 and 72 is controlled by transistors 68 and 70. Transistors 64 and 74 represent only an emitter follower.

Both a pure bipolar technology, a pure CMOS technology, or also a BiCMOS technology having both bipolar and CMOS components can be used for the integration. When CMOS components are used, for example, the aforementioned emitter circuits are replaced by source circuits. Advantages of the bipolar technology are a large transconductance and thereby a large Re(z) even at relatively low collector currents. Advantages of the CMOS technology are that the oscillator circuit can be integrated on a chip together with digital or mixed digital and analog circuits, for which preferably CMOS technologies are used. The BiCMOS technology combines all these advantages.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated quartz oscillator circuit comprising:
   a capacitive voltage divider, which has a first capacitor and a second capacitor;
   a first transconductance amplifier, which is provided in a loop connecting a first junction and a second junction of the first capacitor, an input of the first transconductance amplifier being connected to a center tap between the first capacitor and the second capacitor, an output of the first transconductance amplifier being connected to the first junction of the first capacitor; and
   a conductive element being connected parallel to the second capacitor.

2. The quartz oscillator circuit according to claim 1, wherein the conductive element is an ohmic resistor connected parallel to the second capacitor.

3. The quartz oscillator circuit according to claim 1, wherein the conductive element is a second transconductance amplifier, which has a second input and a second output being connected by a feedback, the second input and the second output being connected between the first capacitor and the second capacitor.

4. The quartz oscillator circuit according to claim 1, wherein the capacitive voltage divider has a series connection comprising the first capacitor, the second capacitor, and a third capacitor.

5. The quartz oscillator circuit according to claim 4, wherein the conductive element is an ohmic resistor that is connected in parallel to the second capacitor.

6. The quartz oscillator circuit according to claim 4, wherein the conductive element is a second transconductance amplifier, which has two inputs and two outputs respectively connected by a feedback, whereby an input of the second transconductance amplifier is connected between the first and the second capacitor, another input of the second transconductance amplifier is connected between the second and the third capacitor, and in each case an output is connected to the input of the first transconductance amplifier.

7. The quartz oscillator according to claim 1, further comprising a circuit-external load capacitor.

8. The quartz oscillator according to claim 1, further comprising an integrated load capacitor.

9. The quartz oscillator according to claim 1, wherein at least one voltage follower is placed in a connection of a connecting terminal of the oscillator circuit with the capacitive voltage divider.

10. The quartz oscillator according to claim 1, wherein the first transconductance amplifier has a transistor in an emitter circuit thereof.

11. The quartz oscillator according to claim 1, wherein at least one transconductance amplifier has a differential stage with two transistors.

* * * * *